March 25, 1969 R. V. GOORDMAN 3,435,364

ULTRALINEAR TRANSISTOR AMPLIFIER

Filed Dec. 20, 1965

INVENTOR
R. V. GOORDMAN

BY [signature]

ATTORNEY 3,435,364
ULTRALINEAR TRANSISTOR AMPLIFIER

Robert V. Goordman, Hackettstown, N.J., assignor to Bell Telephone Laboratories, Incorporated, New York, N.Y., a corporation of New York Filed Dec. 20, 1965, Ser. No. 514,939
Int. Cl. H03f 3/04, 3/18, 3/68
U.S. Cl. 330—24 2 Claims

ABSTRACT OF THE DISCLOSURE

The distortion produced in a transistor amplifier by the nonlinearity of its input impedance, is compensated for by means of an equivalent nonlinearity introduced in the collector circuit of the transistor amplifier. In the illustrative embodiments described, the amplifier collector circuit includes both nonlinear and linear resistive means connected in series. The nonlinear resistance is typically provided by at least one diode, poled in the forward direction. The linear resistance is typically provided by a resistor whose resistance is a function of the impedance of the signal source connected between the emitter and the base of the transistor, and the number of diodes.

This invention relates to transistor amplifiers and, in particular, to means for improving the linearity of such amplifiers.

It is well known that the input impedance of a transistor varies as a function of the instantaneous amplitude of the input signal. For small signal applications this generally is not a very serious problem. However, for those applications in which the input signal has a large dynamic range, the resulting variation in input impedance causes a substantial amount of distortion in the signal. This becomes particularly serious in broadband systems and in multichannel systems where the distortion causes crosstalk and other deleterious modulation effects.

These difficulties have been recognized by workers in the field and various circuit arrangements have been proposed to reduce the amount of distortion produced by a transistor amplifier. These prior art proposals include, among other things, the use of feedback and the particular selection of the operating point. The former method, however, adds a degree of complication and expense to the system which, advantageously, is to be avoided. The latter method is unduly restrictive in that it limits the usefulness of the transistor. In addition, experience has shown that the operating point that is best for linearity often results in a poor noise figure or is otherwise unsatisfactory.

It is, accordingly, an object of this invention to improve the linearity of transistor amplifiers without significantly increasing their complexity or cost.

In accordance with the present invention, the distortion produced in a transistor amplifier by the nonlinearity of its input impedance, is compensated for by means of an equivalent nonlinearity introduced in the collector circuit of the transistor amplifier. In the illustrative embodiment of the invention, to be described in greater detail hereinbelow, the amplifier collector circuit includes both nonlinear and linear resistive means connected in series. The nonlinear resistance is typically provided by at least one diode poled in the forward direction. The linear resistance is typically provided by a resistor whose resistance is a function of the impedance of the signal source connected between the emitter and the base of the transistor, and the number of diodes.

A transistor amplifier, compensated in accordance with the present invention, is ultralinear over a wide range of operating signal levels, and the amplifier gain, which is proportional to the number of diode-resistor pairs included in the collector circuit, is substantially constant over this range of signal levels. It is also a feature of the invention that the transistor amplifier gain is stabilized against both temperature and bias changes.

These and other objects and advantages, the nature of the present invention, and its various features, will appear more fully upon consideration of the various illustrative embodiments now to be described in detail in connection with the accompanying drawings, in which.

Figure 1:
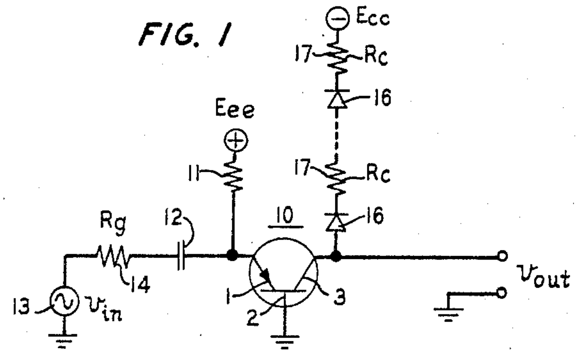
FIG. 1 is a transistor amplifier compensated for variations in signal level in accordance with the invention.

Referring to the drawings, FIG. 1 shows an ultralinear transistor amplifier in accordance with the present invention. As illustrated, the amplifier comprises a transistor 10 having an emitter 1, a base 2 and a collector 3. While transistor 10 is represented as a p-n-p type transistor for purposes of illustration, it is readily understood that an n-p-n type transistor can be used provided the appropriate polarity changes are made in the direct-current biasing and power supply circuits.

In FIG. 1, the base 2 is connected directly to ground and a positive biasing voltage $E_{ee}$ is applied to the emitter through a bias-limiting resistor 11. An input signal $V_{in}$ is applied between the base 2 and emitter 1 through a coupling capacitor 12. The input signal source is represented simply by a generator 13 and an impedance 14 equal to $R_g$. In practice the signal source can be another transistor, an antenna, or the output end of a long transmission line, as examples.

Figure 2:
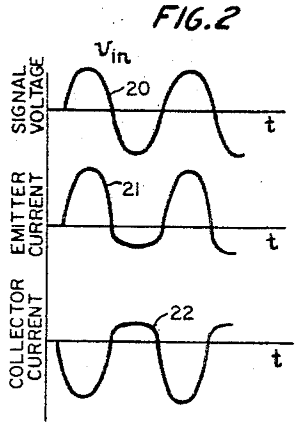
FIG. 2 shows the input signal voltage waveform and the resulting emitter current and collector current.

As is well known in the art, the input impedance of a transistor varies inversely as a function of the instantaneous emitter current. Thus, if the input signal $v_{in}$ applied between the emitter and base of transistor 10 is a simple sine wave, as illustrated by curve 20 in FIG. 2, the input impedance of the transistor tends to decrease during the positive half of the input signal (as the emitter current increases), and tends to increase during the negative half of the input signal (as the emitter current decreases). As a result, the emitter current waveform is not a replica of the signal voltage but, rather, it tends to be larger during the positive half of the input signal than it is during the negative half of the input signal. The resulting distortion of the signal is illustrated by the emitter current curve 21 of FIG. 2. In particular, there is a peaking of the positive half of the signal, and a flattening of the negative half. The resulting collector current, curve 22 of FIG. 2, is 180 degrees out of phase with the emitter current and is similarly distorted.

In accordance with the present invention, the above-described distortion is greatly minimized by the inclusion in the collector circuit of transistor 10 of one or more series-connected sections of compensating nonlinear and linear resistive means. Each of the nonlinear resistive means has a resistance characteristic that varies inversely with current, and is represented in FIG. 1 by a diode 16. Each of the linear resistive means is represented by a resistor 17. The nonlinear resistive means can be obtained by using a two-terminal semiconductor diode, or by using the diode characteristic of the emitter-base connections of a transistor or by any other suitable means known to those skilled in the art. When a diode is used for this purpose, it is connected so as to be biased in the forward direction. Since transistor 10 is illustrated in FIG. 1 as a p-n-p type transistor, the diodes 16 are connected so that their anodes are towards collector 3 and their cathodes are toward the collector power supply $E_{cc}$ which provides a collector voltage that is negative with respect to the base voltage.

The effect of including nonlinear and linear resistances in the collector circuit is to compensate for the nonlinear property of the transistor input impedance. This is best illustrated by first considering the expression for the transducer voltage gain, G, of a common-base transistor amplifier with only a linear resistive load $R_C$ in the collector. This is given by $$G=\frac{V_{out}}{V_{in}}=\frac{\alpha i_c R_C}{i_c(R_g+R_e+[1\alpha-a]r_b)+\frac{m_1 KT}{q}\ln\left(1+\frac{i_c}{I_{OE}+I_e}\right)} \quad (1)$$

where $\alpha$ is the emitter-collector current gain ratio;
$R_g$ is the signal source impedance;
$r_b$ is the base spreading resistance;
$i_e$ is the instantaneous emitter current;
$I_e$ is the emitter bias current;
$I_{OE}$ is the emitter-base reverse-bias saturation current;
K is Boltzmann's constant;
T is the absolute temperature;
$q$ is the electron charge;
$R_C$ is the collector load resistance;
$V_{in}$ is the instantaneous source voltage;
$V_{out}$ is the instantaneous collector voltage;
$m_1$ is a constant characteristic of the emitter-base junction; and
$R_e$ is the emitter series ohmic resistance.

As can be clearly seen from Equation 1, the gain is a function of the instantaneous emitter current $i_e$.

If now the collector load includes both linear and nonlinear resistances, the gain expression becomes $$G=\frac{\alpha i_e(R_L+R_d)+m_2\frac{KT}{q}\ln\left(1\times\frac{\alpha i_e}{I_{OC}+\alpha I_c}\right)}{i_e(R_g+R_o+[1-\alpha]r_b)+m_1\frac{KT}{q}\ln\left(1+\frac{i_e}{I_{OE}+I_o}\right)} \quad (2)$$

Equation 2 can be rewritten as $$G=\frac{m_2\left[\alpha\frac{(R_L+R_d)}{m_2}+\frac{KT}{qi_e}\right]\ln\left(1+\frac{\alpha i_e}{I_{OE}+I_e}\right)]}{m_1\left[\frac{R_g+R_e+(1-\alpha)r_b}{m_1}+\frac{KT}{qi_o}\ln\left(1+\frac{i_e}{I_{OE}+I_e}\right)\right]} \quad (3)$$

where $I_{OC}$ is the reverse-bias diode saturation current;
$R_L$ is the amplitude of the linear resistance;
$R_d$ is the diode series ohmic resistance; and
$m_2$ is a constant, characteristic of the diode.

In order for the gain G, given by Equation 3, to be independent of the emitter current $i_e$, the ratio of the bracketed expressions in Equation 3 must be made to reduce to unity. Noting that the reverse-bias saturation currents $I_{OC}$ for the diode and $I_{OE}$ for the transistor are typically orders of magnitude less than $\alpha I_e$ and $I_e$, respectively, the logarithmic factors in both the numerator and denominator reduce to ln $(1+i_e/I_e)$, making these two terms equal. The remaining terms of the two expressions are made equal by equating term $$\alpha\frac{(R_L+R_d)}{m_2}$$

from the numerator to term $$\frac{R_g+R_e+(1-\alpha)r_b}{m_1}$$

in the denominator. Solving for $R_L$ in terms of $R_g$, $R_e$, $R_d$, $m_1$, and $m_2$ yields $$R_L=\frac{m_2[R_g+R_e+(1-\alpha)r_b]}{m_1\alpha}-R_e \quad (4)$$

Noting that in high quality semiconductor components $R_g$ is typically much larger than $R_e$, $R_d$, and $(1-\alpha)r_b$, Equation 4 reduces to $$R_L\approx\frac{m_2}{m_1}\cdot\frac{R_g}{\alpha} \quad (5)$$

for the usual range of values for $\alpha$, $m_1$ and $m_2$.

Thus, when the total linear resistance for each diode-resistor section is as given by Equation 5, the gain of the amplifier reduces simply to a constant value $G=m_2/m_1$. For $n$ diode-resistor sections, the gain, more generally, becomes $$G=m_2n/m_1 \quad (6)$$

The number of diode-resistor sections included in the collector circuit is selected in accordance with such factors as the desired gain, impedance matching requirements and the amplitude of the collector supply voltage $E_{cc}$. It is apparent that when more than one diode-resistor section is used, all of the separate linear resistors $R_L$ can be replaced by a single linear resistor whose total resistance is $nR_L$.

Figure 4:
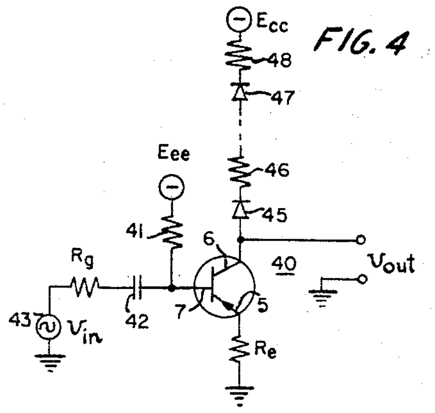
FIG. 4 shows an ultralinear common emitter transistor amplifier in accordance with the invention.

A similar analysis can be made for the common emitter configuration illustrated in FIG. 4. In this embodiment the emitter 5 is connected to ground through an emitter resistor $R_e$, and a negative bias $E_{ee}$ is applied to the base 7 through a bias-limiting resistor 41. An input signal $v_{in}$ is applied between base 7 and ground through a coupling capacitor 42. The signal source is represented by a generator 43 and an impedance $R_g$. The collector 6 is connected to a power source $E_{cc}$ through one or more diode-resistor pairs 45–46 and 47–48. The output signal $v_{out}$ is taken between the collector and ground. For this amplifier configuration, the total effective linear resistance for each diode-resistor section is given by $$R_L=\frac{m_2n}{m_1}\cdot\frac{(1-\alpha)(R_g+r_b)+R_e}{\alpha}-R_d \quad (7)$$

and the gain is $$G=m_2n/m_1 \quad (8)$$

Figure 3:
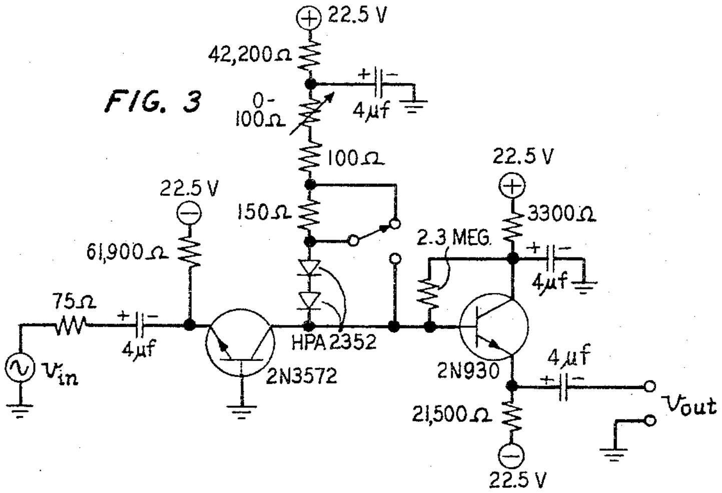
FIG. 3 is a particular embodiment of the invention.

FIG. 3 is an illustrative embodiment of a specific ultralinear amplifier, in accordance with the invention, using two compensating diodes in the amplifier collector circuit. To illustrate the effectiveness of the diodes in reducing the distortion in the amplifier, two series of measurements were made. In the first set of measurements, the compensating diodes were included in the circuit. In the second set of measurements, the diodes were replaced by an equivalent 150 ohm linear resistance. In both instances, the fundamental component of the output signal was measured for different input signal levels and, as a measure of the distortion produced by the amplifier, the second and third harmonic components of the output signal were also measured. The results are tabulated below.

| Fundamental component of output signal, 100 kc., with— | | Second harmonic component of output signal, 200 kc., with— | | Third harmonic component of output signal, 300 kc., with— | |
|---|---|---|---|---|---|
| Diodes in (mv.) | Diodes out (mu.) | Diodes in (μv.) | Diodes out (μv.) | Diodes in (μv.) | Diodes out (μv.) |
| 20 | 18 | 0.70 | 140 | Noise | 1.4 |
| 40 | 36 | 2.95 | 555 | 0.18 | 9.65 |
| 60 | 56 | 6.3 | 1,210 | 0.61 | 32 |
| 80 | 72 | 10.5 | 2,220 | 1.4 | 70 |
| 100 | 85 | 16.3 | 3,600 | 3.15 | 140 |

As can be seen, the amplitude of the fundamental component of the output signal decreases in each instance when the diodes are replaced by their equivalent linear resistance. The decrease in the funamental component is accompanied by a corresponding increase in the harmonic content of the signal. For example, with the diodes in, the funamental components is 20 mv. for the first set of data, and drops to 18 mv. when the diodes are removed. Correspondingly, the second harmonic component increases from 0.70 $\mu$v. to 140 $\mu$v., while the third harmonic increases from an immeasurably low level to 1.4 $\mu$v. This is seen to be so for all levels of output signals. In addition to the significant reduction in distortion, the amplifier gain, $V_{out}/V_{in}$, remains substantially constant at 2.0 for all levels of input signal when the compensating diodes are in the circuit.

The effectiveness of the compensation is also a function of the amplitude of the linear resistance in the collector circuit. In the instant example of a common-base amplifier, the proper total linear resistance per diode-resistor section is given by Equation 4 as $$R_L = \frac{m_2}{m_1\alpha}[R_g + R_e + (1-\alpha)r_b] - R_d$$

To the extent that the actual linear resistance deviates from this preferred value, the reduction in the harmonic content of the output signal with "diodes in" as compared with diodes out," is less effective. A measure of the effectiveness of the compensating network in reducing the harmonic content of the output signal is given by the following harmonic reduction factor $$\frac{\alpha(R_L + R_d) - \frac{m_2}{m^1}[R_g + R_e + (1-\alpha)r_b]}{\alpha\left[R_L + R_d + \frac{m_2 KT}{q\alpha I_e}\right]} \quad (9)$$

Ideally, when $R_L$ is as given by Equation 4, the reduction factor is equal to zero, and the harmonic content of the output signal is reduced to zero. To the extent that $R_L$ deviates from the correct value, the factor is finite and there remains some residue of harmonic content. Similarly, if there are no diodes in the collector circuit, $m_2=0$, and the factor is equal to unity, thus indicating no reduction in harmonic content.

In all cases it is understood that the above-described arrangement is illustrative of but one of the many possible specific embodiments which can represent applications of the principles of the invention. Numerous and varied other arrangements can readily be devised in accordance with these principles by those skilled in the art without departing from the spirit and scope of the invention.

What is claimed is:

1. An ultralinear amplifier comprising:

a transistor, having an emitter, a base and a collector, connected in a common emitter configuration;

input signal means having an impedance $R_g$ connected to said base;

and a load impedance coupled to said collector comprising a linear resistance of magnitude $R_L$ connected in series with $n$ forward-biased diodes;

wherein $R_L$ is substantially equal to $$\frac{nm_2}{\alpha m_1}[(1-\alpha)(R_g + r_b) + R_e] - nR_d$$

where $m_1$ is a constant, characteristic of the emitter-base junction of said transistor, $m_2$ is a constant, characteristic of the diodes, $R_e$ is the emitter series ohmic resistance, $\alpha$ is the emitter-collector current gain ratio of said transistor, $R_d$ is the diode series ohmic resistance, and $r_b$ is the base spreading resistance of said transistor.

2. An ultralinear amplifier comprising:

a transistor, having an emitter, a base and a collector, connected in a common base configuration;

input signal means having an impedance $R_g$ connected to said emitter;

and a load impedance coupled to said collector comprising a linear resistance of magnitude $R_L$ connected in series with $n$ forward-biased diodes;

wherein $R_L$ is substantially equal to $$\frac{nm_2}{\alpha m_1}(R_g + R_e + [1-\alpha]r_b) - nR_g$$

where $m_1$ is a constant, characteristic of the emitter-base junction of said transistor, $m_2$ is a constant, characteristic of the diodes, $R_e$ is the emitter series ohmic resistance, $\alpha$ is the emitter-collector current gain ratio of said transistor, $R_d$ is the diode series ohmic resistance, and $r_b$ is the base spreading resistance of said transistor.

References Cited

UNITED STATES PATENTS 3,377,426 4/1968 Thomas ............ 330—24

OTHER REFERENCES

Herscher, "Designing Transistor A–F Power Amplifiers," Electronics, April 1958, pp. 96–99.

Schuster: D-C Transistor Amplifier for High-Impedance Input, Electronics, February 1958, pp. 64–65.

ROY LAKE, *Primary Examiner.*

LAWRENCE J. DAHL, *Assistant Examiner.*

U.S. Cl. X.R.

330—17